United States Patent [19]

Collins et al.

[11] 4,241,167
[45] Dec. 23, 1980

[54] ELECTROLYTIC BLOCKING CONTACT TO InP

[75] Inventors: David A. Collins; Derek L. Lile, both of San Diego, Calif.

[73] Assignee: The United States of America as represented by the Secretary of the Navy, Washington, D.C.

[21] Appl. No.: 42,466

[22] Filed: May 25, 1979

[51] Int. Cl.³ .................................................. H01L 21/66
[52] U.S. Cl. .................................. 430/314; 148/33.3; 29/574; 324/158 D; 361/433; 427/82; 427/84; 357/66
[58] Field of Search ............... 427/82, 84, 87; 357/66; 430/314; 29/574; 361/433; 324/158 D; 148/33.3

[56] References Cited

U.S. PATENT DOCUMENTS

| | | | |
|---|---|---|---|
| 2,623,102 | 12/1952 | Shockley | 357/20 |
| 2,627,545 | 2/1953 | Muss et al. | 357/66 |
| 3,701,930 | 10/1972 | Tami | 357/66 |
| 3,858,304 | 1/1975 | Leedy | 430/314 |
| 3,977,015 | 8/1976 | Irving et al. | 357/3 |

FOREIGN PATENT DOCUMENTS 999679  7/1965  United Kingdom ...................... 357/66

OTHER PUBLICATIONS

Miller, "A Feedback Method for Investigating Carrier Distributions in Semiconductors," IEEE Transactions on Electron Devices, vol. ED-19, No. 10, Oct. 1972.

*Primary Examiner*—John D. Smith
*Attorney, Agent, or Firm*—Richard S. Sciascia; Ervin F. Johnston; Thomas M. Phillips

[57] ABSTRACT

A liquid barrier contact to InP made of 40% tartatic acid and 30% hydrogen peroxide in a 3:1 ratio by volume is used for capacitance-voltage carrier profiling to large voltages (>10 V) on relatively heavily doped material (>$10^{17}$ CM$^{-3}$) and at room temperature.

4 Claims, 5 Drawing Figures

ELECTROLYTIC BLOCKING CONTACT TO INP

BACKGROUND OF THE INVENTION

Both as a result of its proven performance in Transferred Electron Device (TED) applications as well as its anticipated advantage for Field-Effect Transistor (FET) use, a considerable interest is developing in semiconducting InP and in its growth and properties when in epilayer form. As is the case for GaAs, it would be convenient to be able to obtain carrier concentration profile information for this semiconductor using the Schottky barrier capacitance-voltage technique. The application of this method to InP, however, has been somewhat restricted by the difficulty of reproducibly fabricating high quality Schottky barriers on this material. Attempts have been made to overcome this restriction by cooling the sample, by restricting the measurement range to low voltages as well as by resorting to an MIS measurement. However, all of these approaches are less than ideal. Although many attempts have been reported in the literature for improving Schottky device quality, results using these techniques have been less than encouraging primarily due to irreproducibility of the results particularly on the higher doped samples which are required for FET use.

SUMMARY OF THE INVENTION

The present invention provides for a relatively easy and reproducible means for the formation of a rectifying barrier to InP which facilitates C/V profiling to large voltages (>10 V) on relatively heavily doped material (>$10^{17}$ Cm$^{-3}$) at room temperature.

A high quality barrier is formed by placing in contact with the InP a solution composed of 40% tartaric acid and 30% hydrogen peroxide mixed by volume in the ratio of 3:1. The area of contact on the InP is defined photolithographically by means of a circular aperture in a layer of photoresist.

OBJECTS OF THE INVENTION

An object of the invention is to provide a liquid barrier contact to InP.

Another object is to provide a method of capacitance-voltage carrier profiling of InP.

Figure 1:
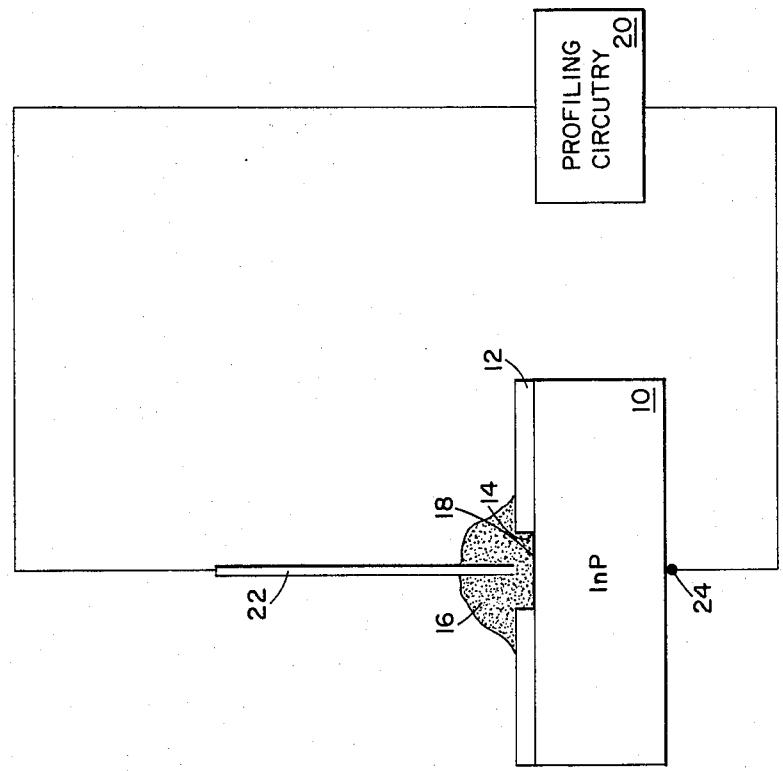
FIG. 1 shows the barrier contact as used in profiling InP.

Referring now to the drawings wherein there is shown in FIG. 1 a sample of InP 10 to be profiled. By the usual photolithography process, a layer of photoresist 12 is deposited on one surface of sample 10. Profiling circuitry 20 is well known in the art and reference may be had to *Physics and Technology of Semiconductor Devices*, by A. S. Grove, John Wiley and Sons, New York, New York, 1967, pp. 169-172, and to "A Feedback Method for Investigating Carrier Distributions in Semiconductors", *IEEE Transactions on Electron Devices*, vol. ED-19, No. 10, October 1972, pp. 1103-1108. A circular aperture is provided for allowing the liquid 16 to contact and form a diode area 18 on sample 10. Connection to the profiling circuitry 20 is made by immersing a platinum wire into the liquid 16 and providing an In-soldered contact 24 to the InP sample 10.

The liquid solution 16 is composed of 40% tartaric acid and 30% hydrogen peroxide mixed by volume in the ratio of 3:1.

Liquid 16, which replaces the metal electrode in the conventional Schottky-barrier measurement, is of sufficient conductivity to allow measurement to all but the highest frequencies. For carrier profiling of InP, frequency of 1 kHz was found to be satisfactory. Prior to applying the liquid 16 to the diode area 18, the InP surface should be prepared by a short time (>30 sec.) etch in dilute HF followed by a wash in DeContam (Electronics Space Products, Inc.) and a final water rinse to enhance wetting and prevent drift. It has been observed that solution 16 does slowly etch the InP to maintain the sample surface relatively oxide-free. The observed etch rate of $\approx$500 Å/hour was found to be sufficiently slow, not to appreciably alter the sample during the measurement period, which typically is not more than fifteen minutes.

Figure 2:
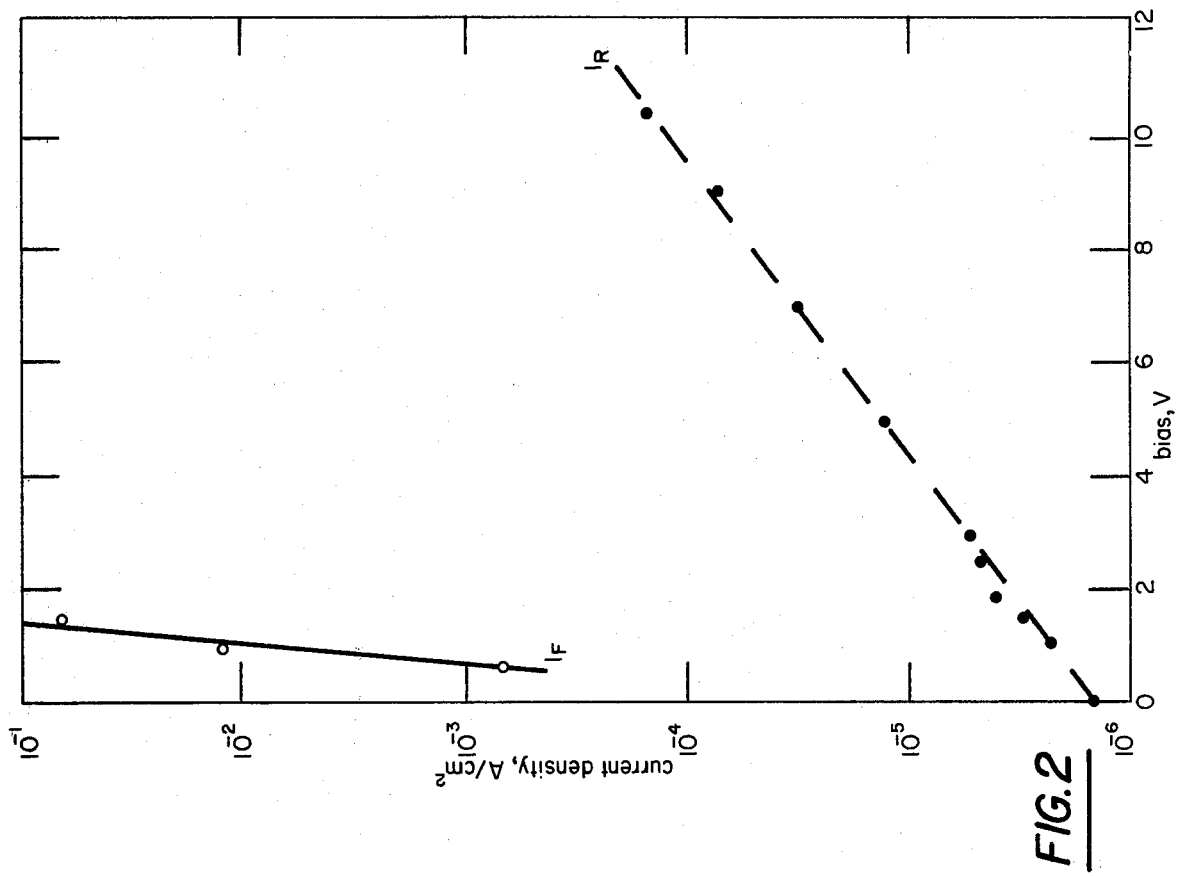
FIG. 2 is a graph showing forward ($I_F$) and reverse ($I_R$) current-density characteristics of an epitaxial InP electrolyte barrier.

As shown in FIG. 2, the forward ($I_F$) and reverse ($I_R$) I/V characteristics of the barrier described above formed on an epitaxial layer of electron concentration $\approx 10^{17}$ Cm$^{-3}$ and a diode area $\approx$3. mm$^2$ are significant. For example, with a bias voltage of 10 volts, a reverse current of only $10^{-4}$ amp/Cm$^2$ was observed.

Figure 3:
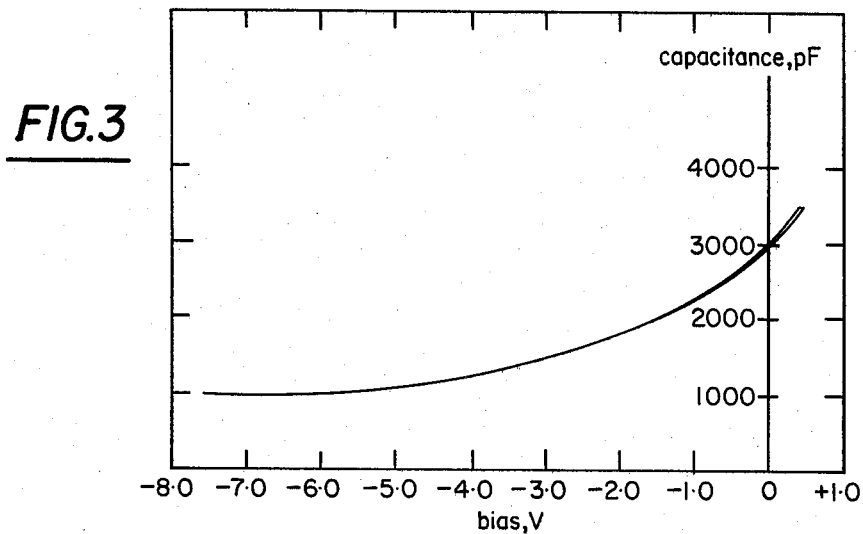
FIG. 3 is a graph showing the C/V characteristic for the same sample as in FIG. 2.

FIG. 3 shows the C/V characteristics for the diode area of the same sample. As can be seen from the graph, there is essentially no hysteresis present.

Figure 4:
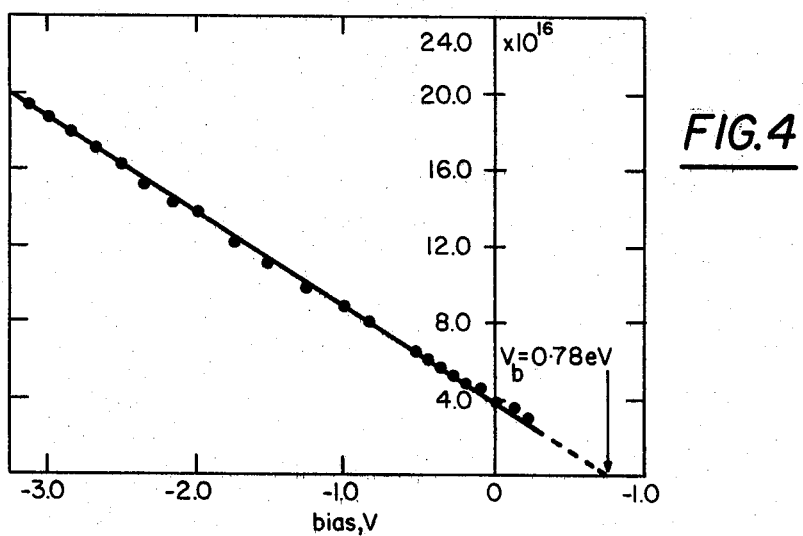
FIG. 4 is a graph showing C/V data on a bulk InP sample replotted as $I/C^2$ against V.

FIG. 4 is a Schottky plot of data taken on a bulk InP sample to show the large barrier height of 0.78 ev obtained, using the liquid barrier 16.

Figure 5:
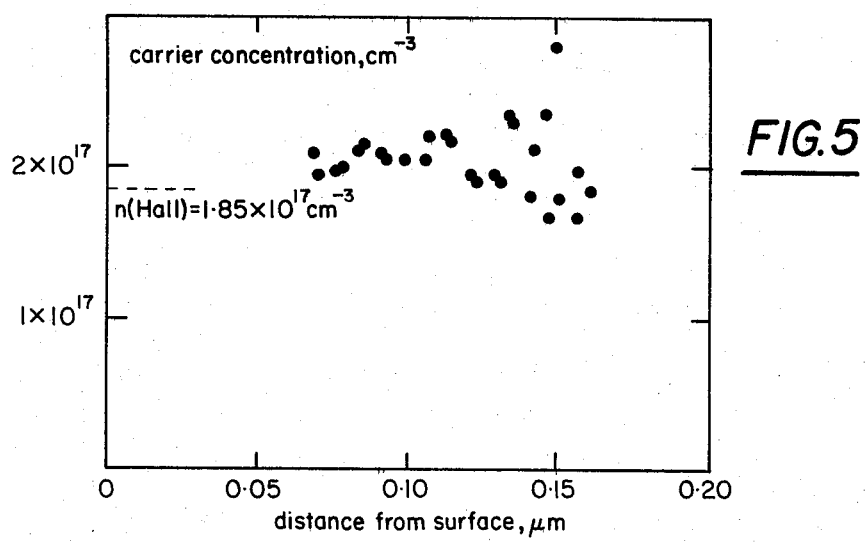
FIG. 5 shows the doping profile using the same data as in FIG. 4.

FIG. 5 shows the doping profile using the same data as in FIG. 4, processed in the profiling circuitry 20. The broken line originating from the ordinate is the doping density obtained from a Hall measurement and shows close agreement between the Hall method and the method described above.

The data used in plotting the graphs of FIGS. 2 and 3 were obtained on an epitaxial InP sample, while the graphs of FIGS. 4 and 5 were obtained on a bulk InP sample. The method then is equally applicable to both epitaxial and bulk InP.

Obviously, many other modifications and variations of the present invention are possible in the light of the above teachings. It is therefore to be understood that within the scope of the appended claims the invention may be practiced otherwise than as specifically described.

What is claimed is:

1. A liquid barrier contact on InP comprising:
   approximately 40% aqueous solution of tartaric acid;
   approximately 30% aqueous peroxide;
   said tartaric acid and said hydrogen peroxide being combined
   in an approximate 3:1 ratio, respectively, by volume.

2. A liquid barrier contact on InP comprising:
   40% aqueous solution of tartaric acid and 30% aqueous hydrogen peroxide mixed in a 3:1, respectively, by volume.

3. In a method of measuring the carrier concentration profile of a semiconducting InP specimen wherein the profile is obtained from measurements of electronic parameters of capacitance and voltage taken across a Schottky diode formed by depositing a rectifying contact upon the semiconducting InP specimen, the improvement comprising the steps of:

coating the InP specimen with photoresist;

forming an aperture in the photoresist to expose an area of InP;

slightly etching said exposed area;

depositing a liquid on said exposed area comprising approximately 40% aqueous solution of tartaric acid mixed with an approximately 30% aqueous solution of hydrogen peroxide in an approximate 3:1 ratio, respectively, by volume.

4. In a method of measuring the carrier concentration profile of a semiconducting InP specimen wherein the profile is obtained from measurements of electronic parameters of capacitance and voltage taken across a Schottky diode formed by depositing a rectifying contact upon the semiconducting InP specimen, the improvement comprising the steps of:

coating the InP specimen with photoresist;

forming an aperture in the photoresist to expose an area of InP;

slightly etching said exposed area;

depositing a liquid on said exposed area comprising 40% aqueous solution of tartaric acid mixed with 30% aqueous solution of hydrogen peroxide in a 3:1 ratio, respectively, by volume.

* * * * *